(12) United States Patent
Ohoka

(10) Patent No.: US 6,303,954 B1
(45) Date of Patent: Oct. 16, 2001

(54) SEMICONDUCTOR DEVICE WITH A HIGH-VOLTAGE COMPONENT IN SEMICONDUCTOR ON INSULATOR

(75) Inventor: Tsukasa Ohoka, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/330,783

(22) Filed: Jun. 11, 1999

(30) Foreign Application Priority Data

Jun. 11, 1998 (JP) .................................................. 10-163174

(51) Int. Cl.$^7$ .................................................. H01L 23/48
(52) U.S. Cl. .................. 257/296; 257/300; 257/368; 438/243
(58) Field of Search .................... 257/296, 300, 257/368, 410, 622, 298, 77, 78, 341, 342, 331, 155, 347, 355; 438/243, 246

(56) References Cited

U.S. PATENT DOCUMENTS

| | | | |
|---|---|---|---|
| 5,198,995 | 3/1993 | Dennard et al. | 365/149 |
| 5,463,234 | 10/1995 | Toriumi et al. | 257/296 |
| 5,485,030 | 1/1996 | Terashima . | |
| 5,679,966 | 10/1997 | Baliga et al. | 257/139 |
| 5,742,076 | 4/1998 | Sridevan et al. | 257/77 |
| 5,998,836 | 12/1999 | Williams | 257/341 |
| 6,025,225 | 2/2000 | Forbes et al. | 438/243 |
| 6,046,476 | 4/2000 | Morishita et al. | 257/347 |
| 6,049,108 | 4/2000 | Williams et al. | 257/341 |

FOREIGN PATENT DOCUMENTS

| | | | |
|---|---|---|---|
| 0 490 437 | 6/1992 | (EP) . | |
| 52127188 | 10/1977 | (JP) | 21/20 |
| 52117592 | 10/1997 | (JP) . | |

*Primary Examiner*—Charles Bowers
*Assistant Examiner*—Laura M Schillinger

(57) ABSTRACT

A semiconductor device comprises a semiconductor layer on an insulator film that is contiguous to a semiconductor substrate. A component, such as a high-voltage diode, forming region is provided in the semiconductor layer and electrically insulated from other component forming regions. A substrate access region is provided in the semiconductor layer and electrically insulated from the component forming region. The substrate access region includes a conductive zone, which extends from the surface down through the semiconductor layer and insulator film to the substrate. A substrate contact is in contact with the conductive zone. The substrate contact and an anode contact of the diode are subject to the same potential.

11 Claims, 8 Drawing Sheets

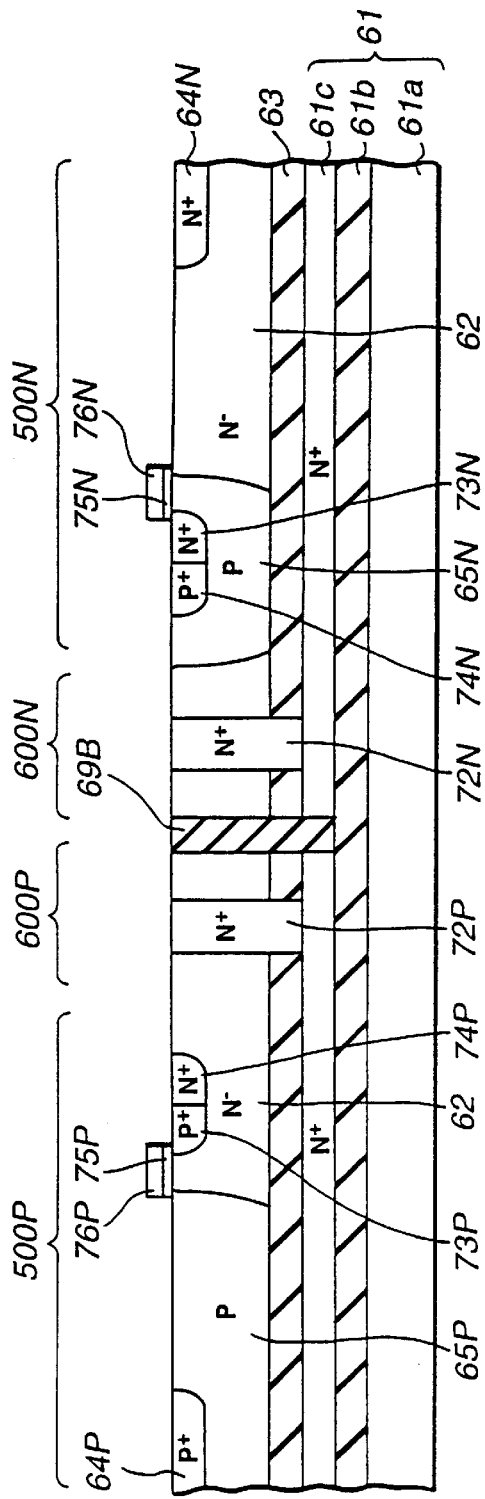
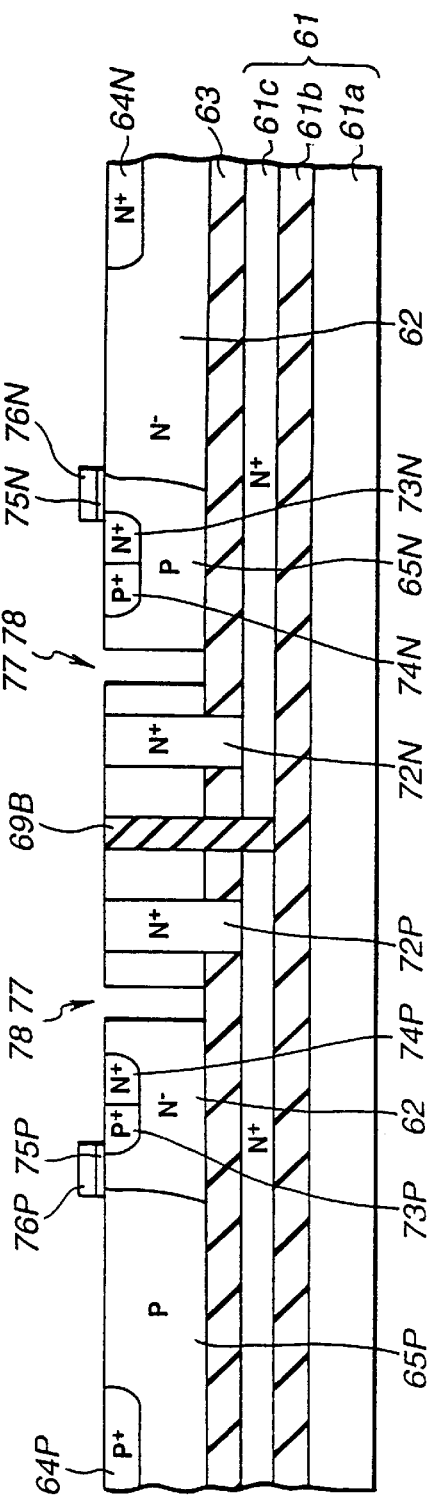

SEMICONDUCTOR DEVICE WITH A HIGH-VOLTAGE COMPONENT IN SEMICONDUCTOR ON INSULATOR

BACKGROUND OF THE INVENTION

1. Field of the Invention

The present invention relates to a semiconductor device. More particularly, the present invention relates to a semiconductor device having at least one component-forming region in a semiconductor layer on an insulator contiguous to a substrate.

2. Description of the Related Art

JP-A 9-97886 discloses a semiconductor device with a high power diode in a semiconductor layer on an insulator film contiguous to a conductive substrate. FIGS. 8 and 9 are simplified illustrations of FIGS. 14 and 15 of the JP-A 9-97886, respectively, and they are used in explaining the known semiconductor device.

Referring to FIG. 8, the reference numeral 1 designates a substrate for supporting a semiconductor. An N-type conductive semiconductor layer 2 is on an insulator film 3 that is contiguous to the substrate 1. At least one of two silicon plates is oxidized at one side and bonded to each other with the oxidized side in by thermal oxidation. One of the silicon layers is polished to provide a semiconductor layer with a predetermined thickness.

Two highly doped zones, namely a N+ type conductive zone 4 and a P+ type conductive zone 5, are diffused into the N− type semiconductor layer 2. The diffusion boundary of the P+ type conductive zone 5 extends down to the insulator film 3. These zones 4 and 5 form the cathode and anode, respectively, of a diode. The cathode 4 is provided with a cathode contact 6. The anode 5 is provided with an anode contact 7. The substrate 1 is provided with a substrate contact 8. Between the cathode contact 6 and the anode contact 7, an insulator file 11 extends laterally so far across the surface of the semiconductor layer 2. The semiconductor layer 2 is electrically insulated and separated into a plurality of component forming regions. An insulator zone 9 extends down to the insulator film 3 and is contiguous to the P+ type conductive zone 5 to electrically insulate a component-forming region in which the diode is formed.

Referring to FIG. 9, the substrate 1 and the anode 5 are at earth potential and the cathode 4 is at high potential. Under this condition, a depletion layer (DP) A extends laterally from the P-N junction between the P+ type conductive zone 5 and the N− type conductive semiconductor 2. A depletion layer (DP) B extends vertically upwards from the interface between the semiconductor layer 2 and the insulator film 3 because the substrate 1 serves as a field plate via the insulator film 3. The depletion layer B facilitates further lateral extension of the depletion layer A. This brings about a considerable reduction in strength of electric field at the P-N junction.

According to this known semiconductor device, a substrate contact 8 extends across the under side of the substrate 1 to keep same at predetermined potential. This involves potential problems as follows:

(1) In light of current movement to a single chip implementation of semiconductor components of a system, a ball grid array (BGA) and a chip size package (CSP) technologies are widely employed as an integrated circuit (IC) package. In these technologies, a chip is connected facedown with a wiring layer by means of bumps formed on the surface of the chip, so that connection of the under side surface of the chip with the wiring layer is difficult to make.

(2) Using insulating paste is the common measure in connecting a chip with a wiring layer by wire bonding and die bonding techniques because it brings down cost of the die bonding. This measure cannot be used in connecting the under side of the chip with the wiring layer.

(3) With the substrate contact at earth potential, the substrate is kept at the earth potential over the entire surface. Thus, a reduction in strength of electric field is not expected in each of all semiconductor components that are distributed over the entire surface of the substrate, if they include N type conductive components and P type conductive components.

The known semiconductor device is fairly well developed in making a reduction in strength of electric field at the P-N Junction. However, a need remains for further development of such semiconductor devices, in light of current movement to a chip-scala packaging.

An object of the present invention is to modify the semiconductor device of the above kind such that it can be implemented as a chip that may be employed by chip-scale packaging technology.

SUMMARY OF THE INVENTION

According to one aspect of the present invention, there is provided a semiconductor device comprising:

a substrate;

an insulator contiguous to said substrate;

a semiconductor layer on said insulator;

a component forming region in said semiconductor layer;

a substrate access region extending from a surface of said semiconductor layer down toward said substrate and electrically insulated from said component forming region; and a substrate contact on the surface of said semiconductor layer within said substrate access region for the control of a surface potential of said substrate.

According to another aspect of the present invention, there is provided a semiconductor device comprising:

a substrate divided into a first region and a second region;

an insulator contiguous to said substrate;

a semiconductor layer on said insulator;

a first component forming region in said semiconductor layer and over said first region of said substrate;

a second component forming region in said semiconductor layer and over said second region of said substrate, said first and second component forming regions being electrically insulated from each other;

a first substrate access region extending from a surface of said semiconductor layer down toward said first region of said substrate and electrically insulated from said first and second component forming regions;

a second substrate access region extending from the surface of said semiconductor layer down toward said second region of said substrate and electrically insulated from said first and second component forming regions, said first and second substrate access regions being electrically insulated from each other;

a first substrate contact on the surface of said semiconductor layer within said first substrate access region for the control of a surface potential of said first region of said substrate; and a second substrate contact on the surface of said semiconductor layer within said second substrate access region for the control of a surface potential of said second region of said substrate.

BRIEF DESCRIPTION OF THE DRAWINGS

FIGS. 7A to 7D illustrate fabrication processes of the third embodiment using the SOI structure shown in FIG. 6D.

DESCRIPTION OF THE PREFERRED EMBODIMENTS

Figure 1:
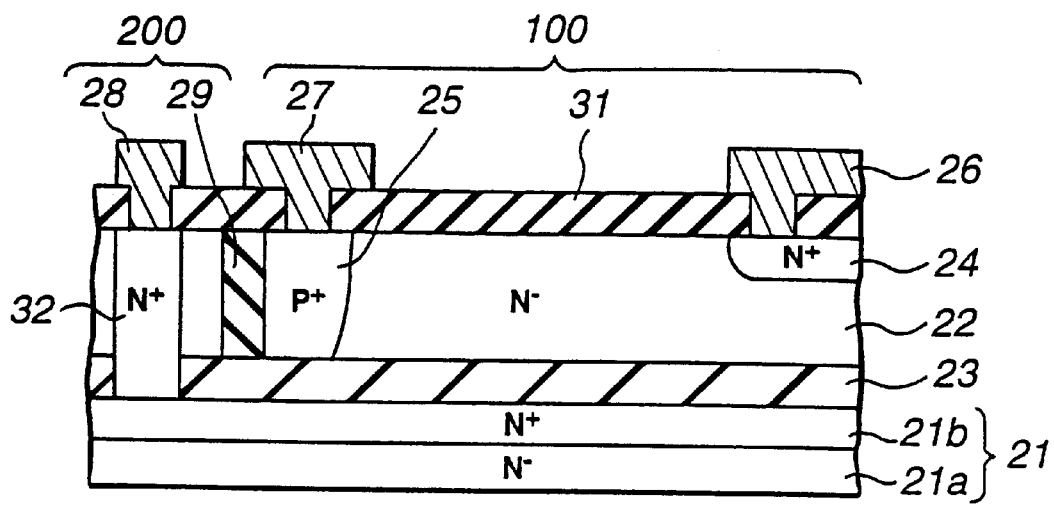
FIG. 1 is a cross section of a first embodiment of a semiconductor device, having a high-voltage diode, according to the present invention.

Referring to FIG. 1, the reference numeral 21 designates a substrate for supporting a semiconductor. The substrate 21 includes a less highly doped layer of a first type conductivity, namely a N− type conductive silicon substrate 21a, and a highly doped layer of the first type conductivity, namely a N+ type conductive semiconductor layer 21b, overlying the silicon substrate 21a. A less highly doped semiconductor layer of the first type conductivity, namely, a N− type conductive semiconductor layer 22 is formed on an insulator film in the form of a silicon dioxide film 23 that is contiguous to the N+ type semiconductor layer 21b. The substrate 21 is of the first type conductivity in this example. If desired, a substrate 21 of a second or P type conductivity may be used. In this case, the substrate 21 includes a less highly doped layer of the second type conductivity, namely a P− type conductive silicon substrate, and a highly doped layer of the second type conductivity, namely a P− type conductive semiconductor layer, overlying the P− type conductive silicon substrate. A substrate 21 may be made in its entirety of a material of N+ type conductivity or P+ type conductivity.

The reference numeral 100 designates a component forming region of the semiconductor layer 22. A high-voltage diode is formed, as a component, in the component forming region 100. Within the component forming region 100, two highly doped zones, namely a N+ type (or the first type) conductive zone 24 and a P+ type (or the second type) conductive zone 25, are diffused into the N− type conductive semiconductor layer 22. The diffusion boundary of the P+ type conductive zone 25 extends down to the silicon dioxide film 23. These zones 24 and 25 form the cathode and anode, respectively, of the high-voltage diode. The cathode 24 is provided with a cathode contact or electrode 26. The anode 25 is provided with an anode contact or electrode 27. An insulator zone 29 extends into the N− type conductive semiconductor layer 22 from the surface thereof to the silicon dioxide film 23 and is contiguous to the P+ type conductive zone 25. This insulator zone 29 electrically insulates and separates a substrate access region 200 from the component-forming region 100. Within the substrate access region 200, a conductive zone 32 of N+ type polysilicon extends into the N− type conductive semiconductor layer 22 and down to the substrate 21 through the silicon dioxide film 23. If the surface layer of the substrate 21 is of the P+ type conductivity, the conductive zone 32 should be formed of P+ type polysilicon. The conductive zone 32 is provided with a substrate contact or electrode 28 on the surface of the semiconductor layer 22. The substrate contact 28 is electrically connected with one of the component electrodes, namely the anode contact 27. Both of the contacts 28 and 27 are kept at the same potential. Between the substrate contact 28, the cathode contact 26 and the anode contact 27, an insulator film 31 extends laterally so far across the surface of the semiconductor layer 22.

In operational mode of the high-voltage diode, the anode contact 27 and the substrate contact 28 are at earth potential and the cathode contact 26 is at higher potential. Under this condition, a depletion layer extends laterally from the P-N Junction between the P+ type conductive zone 25 and the N− type semiconductor layer 22. Through the substrate contact 28 and the conductive zone 32, the substrate 21 is kept at earth potential. Thus, a depletion layer extends vertically upwards from the interface between the semiconductor layer 22 and the silicon dioxide film 23 because the substrate 21 serves as a field plate via the silicon dioxide film 23. This depletion layer facilitates further lateral extension of the first-mentioned depletion layer. This brings about a considerable reduction in strength of electric field at the P-N junction.

The substrate contact 28 on the surface of the semiconductor layer 22 keeps the potential of the substrate 21 as high as that of the anode contact 27, making It unnecessary to provide a contact on the under side of the substrate. This also makes it possible to mount a high-voltage diode within the component forming region 100.

A chip implementation of the first embodiment of the semiconductor device with the high-voltage diode may be employed by BGA and CSP technologies because the substrate contact on the surface is used.

The chip implementation allows the use of insulating paste, which is the common measure to make a cost reduction in die bonding.

In the previous description on the first embodiment, the first type conductivity or conductive has referred to N type conductivity or conductive, and the second type conductivity or conductive P type conductivity or conductive. The first type conductivity or conductive may refer to P type conductivity or conductive and the second type conductivity or conductive N type conductivity or conductive. In this case, the zone 24 is a P+ type conductive zone to become anode and provided with an anode contact, and the zone 25 is a N+ type conductive zone to become cathode and provided with a cathode contact. The substrate contact is connected with the cathode contact so that they may be kept at the same potential. In operational mode of the high-voltage diode, the anode contact is at earth potential and the substrate and cathode contacts are at higher potential. Under this condition, a depletion layer extends laterally from the P-N junction between the N+ type conductive zone and the semiconductor layer. Through the substrate contact and the conductive zone, the substrate is kept at higher potential. Thus, a depletion layer extends vertically upwards from the interface between the semiconductor layer and the silicon dioxide film because the substrate serves as a field plate via the silicon dioxide film. This depletion layer facilitates further lateral extension of the first-mentioned depletion layer. This brings about a considerable reduction in strength of electric field at the P-N junction.

Figure 2:
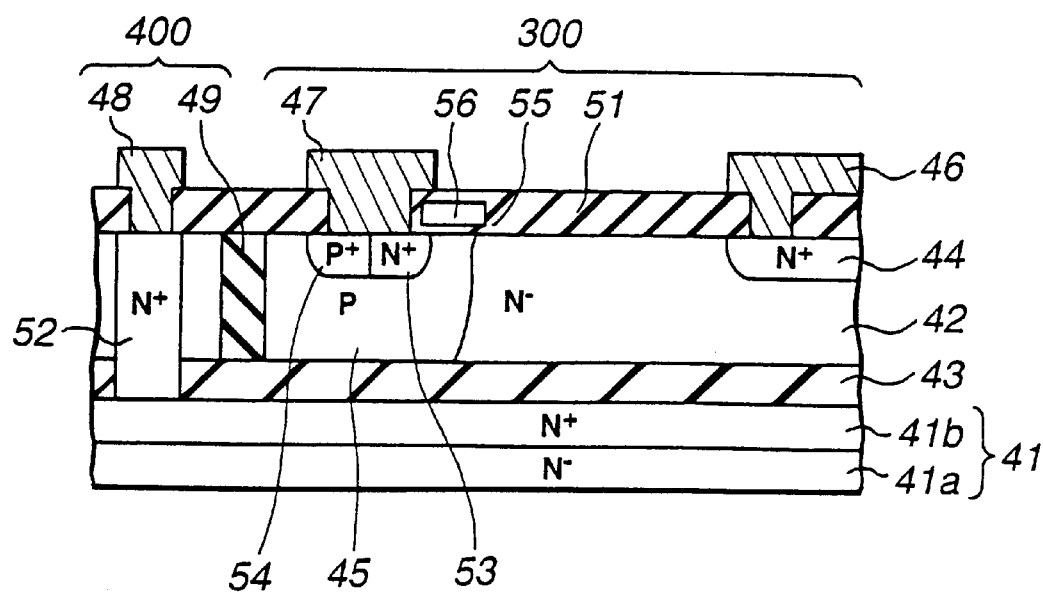
FIG. 2 is a cross section of a second embodiment of a semiconductor device, having a high-voltage MOSFET, according to the present invention.

FIG. 2 illustrates the second embodiment, which includes as a component a first type HOSFET in the form of an N channel high-voltage MOSFET.

Referring to FIG. 2, the reference numeral 41 designates a substrate for supporting a semiconductor. The substrate 41 includes a less highly doped layer of a first type conductivity, nuely a N− type conductive silicon substrate 41a, and a highly doped layer of the first type conductivity, namely a N+ type conductive semiconductor layer 41b, overlying the silicon substrate 41a. A less highly doped semiconductor layer of the first type conductivity, namely, a N− type conductive semiconductor layer 42 is formed on an insulator film in the form of a silicon dioxide film 43 that is contiguous to the N+ type semiconductor layer 41b. The substrate 41 is of the first type conductivity in this example. If desired, a substrate 41 of a second or P type conductivity may be used. In this case, the substrate 41 includes a less highly doped layer of the second type conductivity, namely a P− type conductive silicon substrate, and a highly doped layer of the second type conductivity, namely a P+ type conductive semiconductor layer, overlying the P− type conductive silicon substrate. The substrate 41 may be made in its entirety of a material of N+ type conductivity or P+ type conductivity.

The reference numeral 300 designates a component forming region of the semiconductor layer 42. A high-voltage MOSFET is formed, as a component, in the component forming region 300. Within the component forming region 300, two doped zones, namely a N+ type (or the first type) conductive zone 44 and a P type (or the second type) conductive zone 45, are diffused into the N− type conductive semiconductor layer 42. The diffusion boundary of the P type conductive zone 45 extends down to the silicon dioxide film 43. Two highly doped zones, namely an N+ type conductive zone 53 and a P+ type conductive zone 54, are diffused into the P type conductive zone 45 from the surface. The N+ type conductive zone 53 is spaced from P-N junction between the semiconductor layer 42 and the P type conductive zone 45 by a predetermined distance to define therebetween a channel. The P+ type conductive zone 54 adjoins the N+ type conductive zone 53. The N+ type conductive zone 44 is provided with a drain contact or electrode 46. The adjoining N+ type conductive zone 53 and P+ type conductive zone 54 are provided with a source contact or electrode 47. An insulator zone 49 extends into the N− type conductive semiconductor layer 42 from the surface thereof to the silicon dioxide film 43 and is contiguous to the P type conductive zone 45. This insulator zone 49 electrically insulates and separates a substrate access region 400 from the component-forming region 300. Within the substrate access region 400, a conductive zone 52 of N+ type polysilicon extends into the N− type conductive semiconductor layer 42 and down to the substrate 41 through the silicon dioxide film 43. If the surface layer of the substrate 41 is of the P+ type conductivity, the conductive zone 52 should be formed of P+ type polysilicon. The conductive zone 52 is provided with a substrate contact or electrode 48 on the surface of the semiconductor layer 42. The substrate contact 48 is electrically connected with one of the component electrodes, namely the source contact 47. Both of the contacts 48 and 47 are kept at the same potential. Between the substrate contact 48, the drain contact 46 and the source contact 47, an insulator film 51 extends laterally so far across the surface of the semiconductor layer 42. A gate contact or electrode 56 is formed within the insulator film 51. The gate contact 56 faces the channel via a gate oxidation layer 42 that is included by the insulator film 51.

In operational mode of the N-channel high-voltage MOSFET, the source contact 47 and the substrate contact 48 are at earth potential and the drain contact 46 is at higher potential with the gate contact 56 in OFF state. Under this condition, a depletion layer extends laterally from the P-N junction between the P type conductive zone 45 and the N− type semiconductor layer 42. Through the substrate contact 48 and the conductive zone 52, the substrate 41 is kept at earth potential. Thus, a depletion layer extends vertically upwards from the interface between the semiconductor layer 42 and the silicon dioxide film 43 because the substrate 41 serves as a field plate via the silicon dioxide film 43. This depletion layer facilitates further lateral extension of the first-mentioned depletion layer. This brings about a considerable reduction in strength of electric field at the P-N junction.

The substrate contact 48 on the surface of the semiconductor layer 42 keeps the potential of the substrate 41 as high as that of the anode contact 47, making it unnecessary to provide a contact on the under side of the substrate. This also makes it possible to mount a high-voltage diode within the component forming region 300.

A chip implementation of the second embodiment of the semiconductor device with the high-voltage MOSFET may be employed by BGA and CSP technologies because the substrate contact on the surface is used.

The chip implementation allows the use of insulating paste, which is the common measure to make a cost reduction in die bonding.

In the previous description on the second embodiment, the first type conductivity or conductive has referred to N type conductivity or conductive, and the second type conductivity or conductive P type conductivity or conductive. The first type conductivity or conductive may refer to P type conductivity or conductive and the second type conductivity or conductive N type conductivity or conductive. In this case, a P channel high-voltage MOSFET is formed. In the operational mode of the P channel high-voltage MOSFET, the drain contact is at earth potential and the substrate and source contacts are at higher potential with the gate contact in OFF state. Under this condition, a depletion layer extends laterally from the P-N Junction between the N+ type conductive zone and the semiconductor layer. Through the substrate contact and the conductive zone, the substrate is kept at higher potential. Thus, a depletion layer extends vertically upwards from the interface between the semiconductor layer and the silicon dioxide film because the substrate serves as a field plate via the silicon dioxide film. This depletion layer facilitates further lateral extension of the first-mentioned depletion layer. This, brings about a considerable reduction in strength of electric field at the P-N junction.

Figure 3:
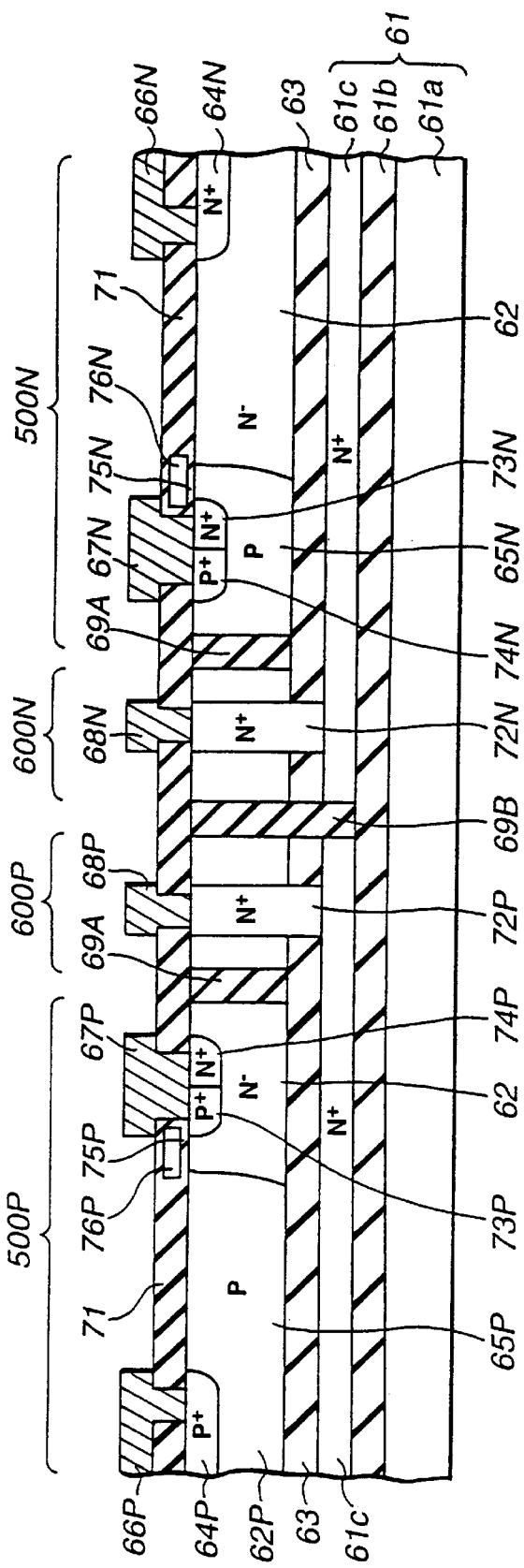
FIG. 3 is a cross section of a third embodiment of a semiconductor device, having an N-channel MOSFET and a P-channel MOSFET, according to the present invention.

FIG. 3 illustrates the third embodiment, which includes as a first component a first type MOSFET in the form of an N channel high-voltage MOSFET and as a second component a second type MOSFET in the form of a P channel high-voltage MOSFET.

Referring to FIG. 3, the reference numeral 61 designates a substrate for supporting a semiconductor. A less highly doped semiconductor layer of the first type conductivity, namely, a N− type conductive semiconductor layer 62 is formed on a first insulator film in the form of a silicon dioxide film 63 that is contiguous to the surface of the substrate 61. The substrate 61 includes a less highly doped layer of a first type conductivity, namely a N− type conductive silicon substrate 61a, a second insulator film in the form of a silicon dioxide film 61b overlying the silicon substrate 61a, and a substrate conductive layer 61c of a N+ type polysilicon overlying the second insulator film 61b. The substrate 61 is of the first type conductivity, namely N type, in this example. If desired, a substrate conductive layer 61c may be formed of a highly doped second conductive material, namely a P+ type polysilicon. In this case, the substrate 61a may be in the form of an N type or a P type.

The reference numeral 500N designates a first component forming region of the semiconductor layer 62. An N channel high-voltage MOSFET is formed, as a component, in the component forming region 500N. Within the component forming region 500N, two doped zones, namely an N+ type (or the first type) conductive zone 64N and a P type (or the second type) conductive zone 65N, are diffused into the N-type conductive semiconductor layer 62. The diffusion boundary of the P type conductive zone 65N extends down to the first insulator film in the form of, the silicon dioxide film 63. Two highly doped zones, namely an N+ type conductive zone 73N and a P+ type conductive zone 74N, are diffused into the P type conductive zone 65N from the surface. The N+ type conductive zone 73N is spaced from P-N junction between the semiconductor layer 62 and the P type conductive zone 65N by a predetermined distance to define therebetween a channel. The P+ type conductive zone 74N adjoins the N+ type conductive zone 73N. The N+ type conductive zone 64N is provided with a drain contact or electrode 66N. The adjoining N+ type conductive zone 73N and P+ type conductive zone 74N are provided with a source contact or electrode 67N.

The reference numeral 500P designates a second component forming region of the semiconductor layer 62. A P channel high-voltage MOSFET is formed, as a component, in the component forming region 500P. Within the component forming region 500P, two doped zones, a P type conductive zone 65P is diffused into the N− type conductive semiconductor layer 62. The diffusion boundary of the P type conductive zone 65P extends down to the first insulator film in the form of the silicon dioxide film 63. Two highly doped zones, namely a P+ type conductive zone 73P and an N+ type conductive zone 74P, are diffused into the N− type conductive semiconductor layer 62 from the surface. The P+ type conductive zone 73P is spaced from P-N junction between the semiconductor layer 62 and the P type conductive zone 65P by a predetermined distance to define therebetween a channel. The N+ type conductive zone 74P adjoins the P+ type conductive zone 73P. A highly doped zone, namely a P+ type conductive zone 64P, is diffused into the P type conductive zone 65P. The P+ type conductive zone 64P is provided with a drain contact or electrode 66P. The adjoining P+ type conductive zone, 73P and N+ type conductive zone 74P are provided with a source contact or electrode 67P.

A first insulator zone 69A extends into the N− type, conductive semiconductor layer 62 from the surface thereof to the silicon dioxide film 63. The insulator zone 69A includes a portion contiguous to the P type conductive zone 65N within the first component forming region 500N and another portion contiguous with the N− type semiconductor layer 62 within the second component forming region 500P. The insulator zone 69A electrically insulates and separates a first substrate access region 600N from the first component forming region 500N and a second substrate access region 600P from the second component forming region 500P. A second insulator zone 69B extends into the N− type conductive semiconductor layer 62 and down to the second insulator film 61b of the substrate 61 to electrically separate or divide the N+ substrate conductive layer 61c into a first region and a second region and to insulate each other. The second insulator zone 69 electrically insulates the first and second substrate access regions 600N and 600P from each other. The first component forming region 500N and the adjacent substrate access region 600N extend over the first region of the substrate 61. The second component forming region 500P and the adjacent substrate access region 600P extend over the second region of the substrate 61. Within the first substrate access region 600N, a first conductive zone 72N of N+ type polysilicon extends into the N− type conductive semiconductor layer 62 and down to the substrate conductive layer 61c through the first insulator film 63. Within the second substrate access region 600P, a second conductive zone 72P of N+ type polysilicon extends into the N− type conductive semiconductor layer 62 and down to the substrate conductive layer 61c through the first insulator film 63. If the surface layer of the substrate 61 is of the P+ type conductivity, the first and second conductive zones 72N and 72P should be formed of P+ type polysilicon. The first conductive zone 72N is provided with a first substrate contact or electrode 68N on the surface of the semiconductor layer 62. The second conductive zone 72P is provided with a second substrate contact or electrode 68P. The first substrate contact 68N is electrically connected with one of the component electrodes, namely the source contact 67N. Both of the contacts 68N and 67N are kept at the same potential. The second substrate contact 68P is electrically connected with one of the component electrodes, namely the source contact 67P. Both of the contacts 68P and 67P are kept at the same potential. Between the substrate contacts 68N, 68P, the drain contacts 66N, 66P and the source contacts 67N, 67P, an insulator film 71 extends laterally so far across the surface of the semiconductor layer 62. For the N channel MOSFET, a gate contact or electrode 76N is formed within the insulator film 71. The gate contact 76N faces the channel via a gate oxidation layer 75N that is included by the insulator film 71. For the P channel MOSFET, a gate contact or electrode 76P is formed within the insulator film 71. The gate contact 76P faces the channel via a gate oxidation layer 75P that is included by the insulator film 71.

In operational mode of the N-channel high-voltage MOSFET, the source contact 67N and the substrate contact 68N are at earth potential and the drain contact 66N is at higher potential with the gate contact 76N in OFF state. Under this condition, a depletion layer extends laterally from the P-N junction between the P type conductive zone E65N and the N− type semiconductor layer 62. Through the substrate contact 68N and the conductive zone 72N, the first region of the substrate conductive layer 61c of the substrate 61 is kept at earth potential. The first region of the substrate conductive layer 61c extends under the first component forming region 500N and the adjacent first substrate access region 600N. Thus, a depletion layer extends vertically upwards from the interface between the semiconductor layer 62 and the first insulator film in the form of the silicon dioxide film 63 because the first region of the substrate conductive layer 61c serves as a field plate via the silicon dioxide film 63. This depletion layer facilitates further lateral extension of the above-mentioned depletion layer. This brings about a considerable reduction in strength of electric field at the P-N junction.

In operational mode of the P-channel high-voltage MOSFET, the drain contact 66P is at earth potential and the source contact 67P and the substrate contact 68P are at higher potential with the gate contact 76P in OFF state. Under this condition, a depletion layer extends laterally from the P-N junction between the P type conductive zone 65P and the N– type semiconductor layer 62. Through the substrate contact 68P and the conductive zone 72P, the second region of the substrate conductive layer 61c of the substrate 61 is kept at higher potential. The second region of the substrate conductive layer 61c extends under the second component forming region 500P and the adjacent second substrate eceos region 600P. Thus, a depletion layer extends vertically upwards from the interface between the semiconductor layer 62 and the first insulator film in the form of the silicon dioxide film 63 because the second region of the substrate conductive layer 61c serves as a field plate via the silicon dioxide film 63. This depletion layer facilitates further lateral extension of the above-mentioned depletion layer. This brings about a considerable reduction in strength of electric field at the P-N junction.

The first and second substrate contacts 68N and 68P, which are on the surface of the semiconductor layer 62, keep potentials of the first and second regions of the substrate conductive layer 61c as high as those of the source contacts 67N and 67P, respectively. This makes it unnecessary to provide contacts on the under side of the substrate. This also makes it possible to mount both an N channel high-voltage NOSFET and a P channel high-voltage MOSFET within the first and second component forming regions 500N and 500P, which extend over the first and second regions of the substrate conductive layer 61c, respectively.

A chip implementation of the second embodiment of the semiconductor device with the high-voltage MOSFET may be employed by BGA and CSP technologies because the substrate contact on the surface is used.

The chip implementation allows the use of insulating paste, which is the common measure to make a cost reduction in die bonding.

Employing a chip implementing the third embodiment of the semiconductor apparatus give considerable reduction in electric field at P-N junction in each of the N channel and P channel high voltage NOSFETs in operational mode of the chip with its under side kept at earth potential.

In the previous description on the third embodiment, the first type conductivity or conductive has referred to N type conductivity or conductive, and the second type conductivity or conductive P type conductivity or conductive. The first type conductivity or conductive may refer to P type conductivity or conductive and the second type conductivity or conductive N type conductivity or conductive. In this case, a P channel high-voltage MOSFET is formed in the first component forming region and an N channel high-voltage MOSFET is formed in the second component forming region.

FIGS. 4A through 4D demonstrate the fabrication of the substrate 41 employing SOI structure. This SOI substrate is used in the process of fabrication of the structure of the second embodiment as shown in FIG. 2. It can also be used in the process of fabrication of the structure of the first embodiment as shown in FIG. 1.

FIGS. 5A through 5C and 2 demonstrate fabrication of the structure as shown in FIG. 2.

Figure 4A:
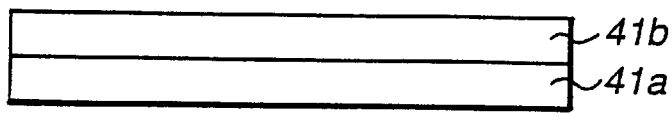
FIGS. 4A to 4D illustrate fabrication processes of a semiconductor-on-insulator (SOI) structure used in the second embodiment.
Figure 4B:
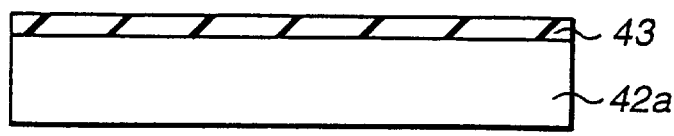
Figure 4C:
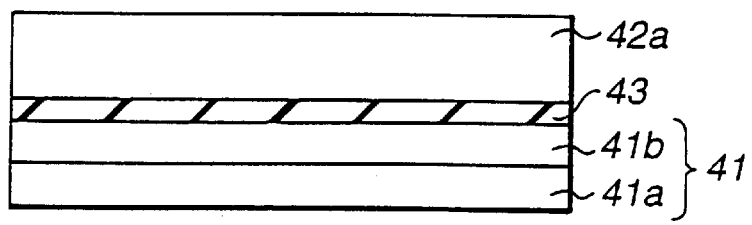
Figure 4D:
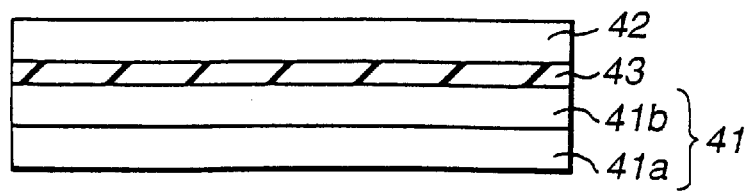

Starting with an N– type silicon base layer 41a, an N+ type semiconductor layer 41b is formed over the surface as shown in FIG. 4A. A silicon dioxide layer 43 is formed over the surface of an N– type silicon bass layer 42a as shown in FIG. 4B by thermal oxidation. The base layer 55a shown in FIG. 4B is bonded to the base layer 41a shown in FIG. 4A with the silicone dioxide layer 43 facing the N+ type semiconductor layer 41b by thermal treatment. This results in the profile as shown in FIG. 4C. The N– type silicon base layer 42a is polished to provide a semiconductor layer 42 having a predetermined thickness as shown in FIG. 4D.

Figure 5A:
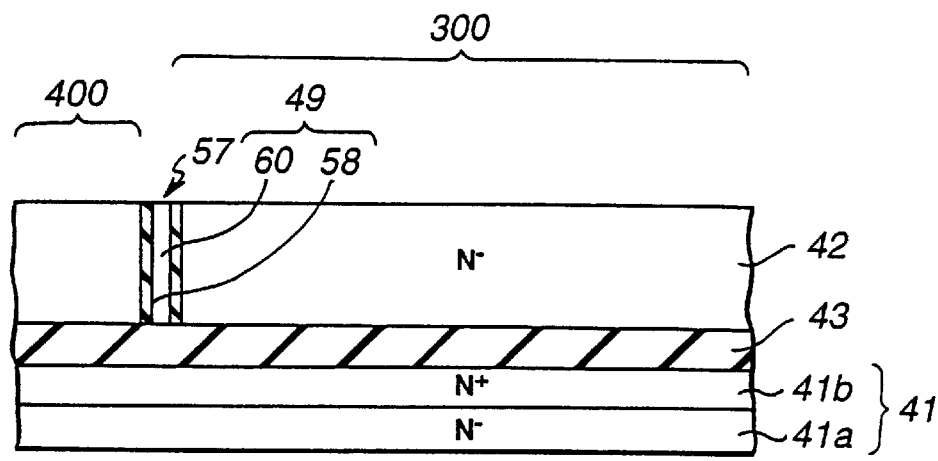
FIGS. 5A to 5C illustrate fabrication processes of the second embodiment using the SOI structure shown in FIG. 4D.

Selective dry etching technique is used to make a groove 57 that extends from the surface of the semiconductor layer 42 down to the surface of the silicon dioxide layer 43. The groove 57 is disposed and extends laterally in such a manner as to separate the substrate access region 400 from the component forming region 300. Thermal oxidation technique is used to form a silicon dioxide film 58 over inner walls of the groove 57. A chemical vapor deposition (CVD) technique is used to deposit a high resistive polysilicon layer 60 over the SOI substrate to fill the groove 57 for subsequent removal by CMP (Chemical Mechanical Polishing) except the polysilicon layer 60 filling the groove 57 as shown in FIG. 5A. The polysilicon may be removed by dry etching or wet etching instead of CMP. The polysilicon layer 60 surrounded by the silicon dioxide film 58 within the groove 57 results in the insulator zone 49.

Figure 5B:
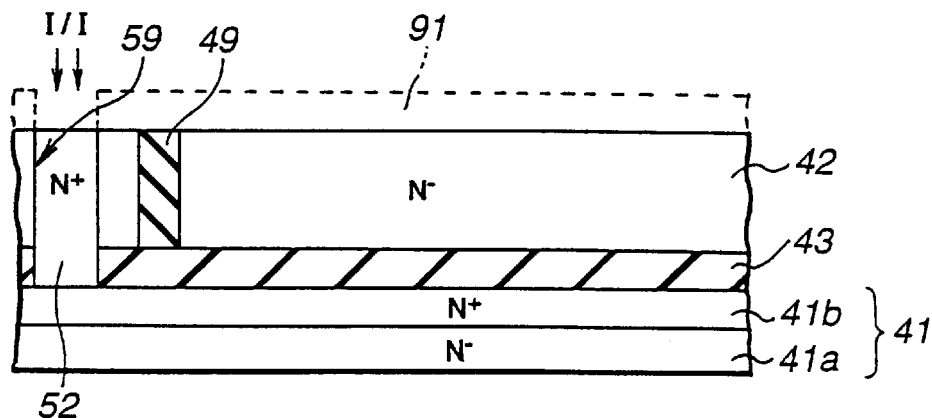

Selective dry etching technique is used to make a substrate access groove 59 within the substrate access region 400 that is insulated from the component forming region 300 by the insulator zone 49. The substrate access groove 59 extends from the surface of the semiconductor layer 42 down to the surface layer of the substrate 41 through the silicon dioxide layer 43. CVD technique is used to deposit a high resistive polysilicon over the SOI substrate to fill the substrate access groove 59 for subsequent removal by CMP (Chemical Mechanical Polishing) except the polysilicon layer filling the groove 59 as Shown in FIG. 5B. The polysilicon may be removed by dry etching or wet etching instead of CMP. As shown by the dotted line in FIG. 5B, a photoresist 91 is used as a mask for ion implantation of phosphorus (P) into the polysilicon filling the substrate access groove 59. After removal of the photoresist 91, the phosphorus (P) is thermally diffused to form the N+ type conductive zone 52. The high resistive polysilicon film and the subsequent ion implantation may be replaced by filling the substrate access groove 59 with a low resistive polysilicon containing phosphorus (P).

Figure 5C:
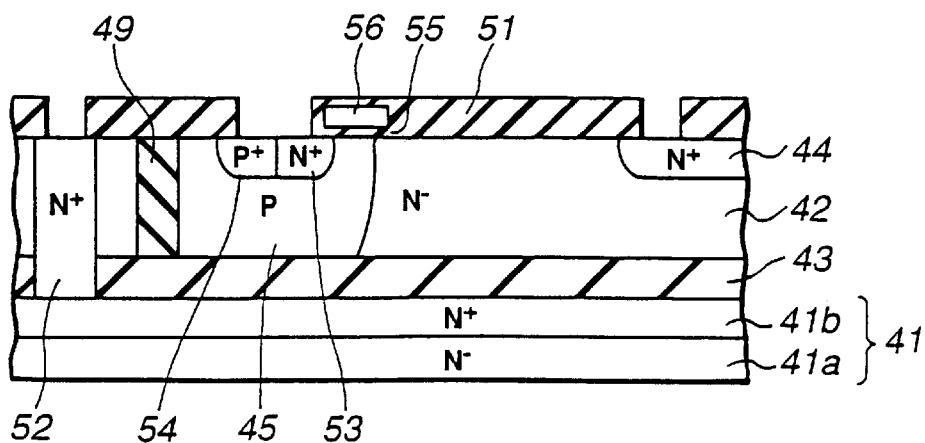

Referring to FIG. 5C, a known technique to used to form an N channel high-voltage MOSFET within the component forming region 300. A P type semiconductor zone 45 extends from the surface of the semiconductor layer 42 down to the surface of the silicone dioxide film 43 along the sidewall of the insulator zone 49. A N+ type semiconductor zone 44 extends into the semiconductor layer 42 from the surface at a central portion surrounded by the P type semiconductor zone 45. A N+ type semiconductor zone 53 and a P+ type semiconductor zone 54 extend into the P type conductive zone 45 from the surface. The N+ type conductive zone 53 is spaced from P-N junction between the semiconductor layer 42 and the P type conductive zone 45 by a predetermined distance to define therebetween a channel. The P+ type semiconductor zone 54 adjoins the N+ type semiconductor zone 53. An insulator film 51 is deposited on the surface of the semiconductor layer 42 except areas where a drain contact 46, a source contact 47 and a substrate contact 48 are adapted to contact the surface of the semiconductor layer 42. The insulator film 51 is formed of a silicon dioxide film due to thermal oxidation technique and an interlayer insulator film due to CVD technique. Within the insulator film 51, a gate contact 56 faces the channel via a gate oxidation layer 55.

With sputtering, an aluminum film is formed over the surface of the SOI substrate. The aluminum film is removed, by photolithography and dry etching, except portions, which will make a drain contact 46, a source contact 47 and a substrate contact 48, respectively. The drain contact 46 is on the N+ type semiconductor zone 44. The source contact 47 is on the N+ type semiconductor zone 53 and the P+ type semiconductor zone 54. The substrate contact 48 is an the conductive zone 52. The substrate contact 48 is electrically connected with the source contact 47 to receive the same potential.

In the fabrication steps as shown in FIGS. 4A through 4D and FIGS. 5A to 5C, the insulator zone 49 is formed prior to formation of semiconductor zones within the component forming region 300. The insulator zone 49 may be formed after the formation of semiconductor zones within the component-forming region 300. This is employed in the fabrication of the structure of the third embodiment, which will be discussed hereinafter. In this case, the CMP after filling the groove can be eliminated.

FIGS. 6A through 6D demonstrate the fabrication of the substrate 61 employing SOI structure. This SOI substrate is used in the process of fabrication of the structure of the third embodiment as shown in FIG. 3.

FIGS. 7A through 7D and 3 demonstrate fabrication of the structure as shown in FIG. 3.

Figure 6A:
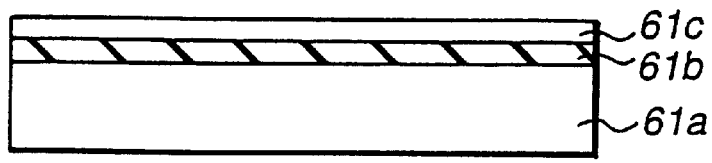
FIGS. 6A to 6D illustrate fabrication processes of a semiconductor-on-insulator (SOI) structure used in the third embodiment.
Figure 6B:
Figure 6C:
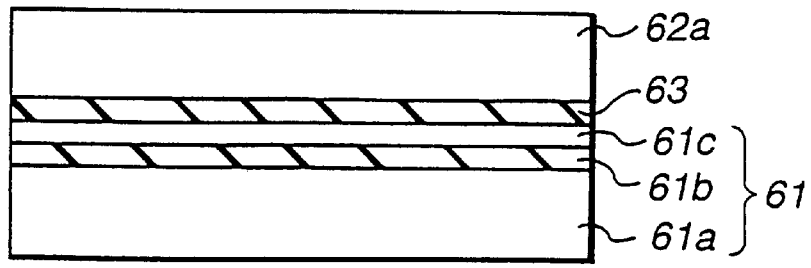
Figure 6D:
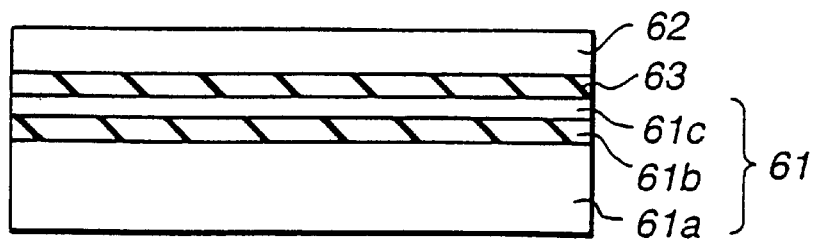

Starting with an N− type silicon base layer 61a with a silicone dioxide film 61b thereon, an N+ type conductive layer 61c is formed over the N− type silicon base layer 61a via the silicon dioxide film 61b as shown in FIG. 6A. The N+ type conductive layer 61c is formed of polysilicon containing phosphorus (P). A silicon dioxide layer 63 is formed over the surf ace of an N− type silicon base layer 62a as shown in FIG. 6B by thermal oxidation, The base layer 62a shown in FIG. 6B is bonded to the base layer 61a shown in FIG. 6A with the silicon dioxide layer 63 facing the N+ type conductive layer 61c by thermal treatment. This results in the profile as shown in FIG. 6C. The N− type silicon base layer 62a is polished to provide a semiconductor layer 62 having a predetermined thickness as shown in FIG. 6D.

Figure 7A:
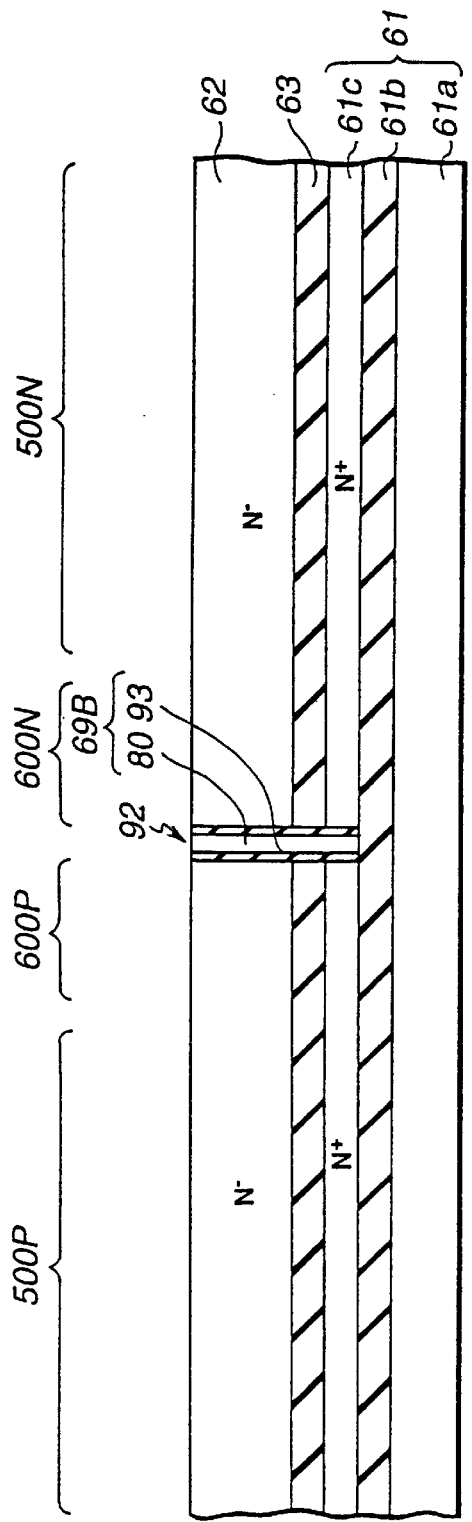

Selective dry etching technique is used to make a groove 92 that extends from the surface of the semiconductor layer 62 down to the surface of the silicon dioxide layer 61b through the silicon dioxide layer 63 and the conductive layer 61c. This results in dividing the conductive layer 61c into a first region and a second region. The first region of the conductive layer 61c is disposed under and coextends with a first component forming region 500N and a first substrate access region 600N. The second region of the conductive layer 61c is disposed under and coextend with a second component forming region 500P and a second substrate access region 600P. Thermal oxidation technique is used to form a silicon dioxide film 93 over inner walls of the groove 92. CVD technique is used to deposit a high resistive polysilicon layer 80 over the SOI substrate to fill the groove 92 for subsequent removal by CMP (Chemical Mechanical Polishing) except the polysilicon layer 80 filling the groove 92 as shown in FIG. 7A. The Polysilicon may be removed by dry etching or wet etching instead of CMP. The polysilicon layer 80 surrounded by the silicon dioxide film 93 within the groove 92 results in the insulator zone 69B.

Figure 7B:
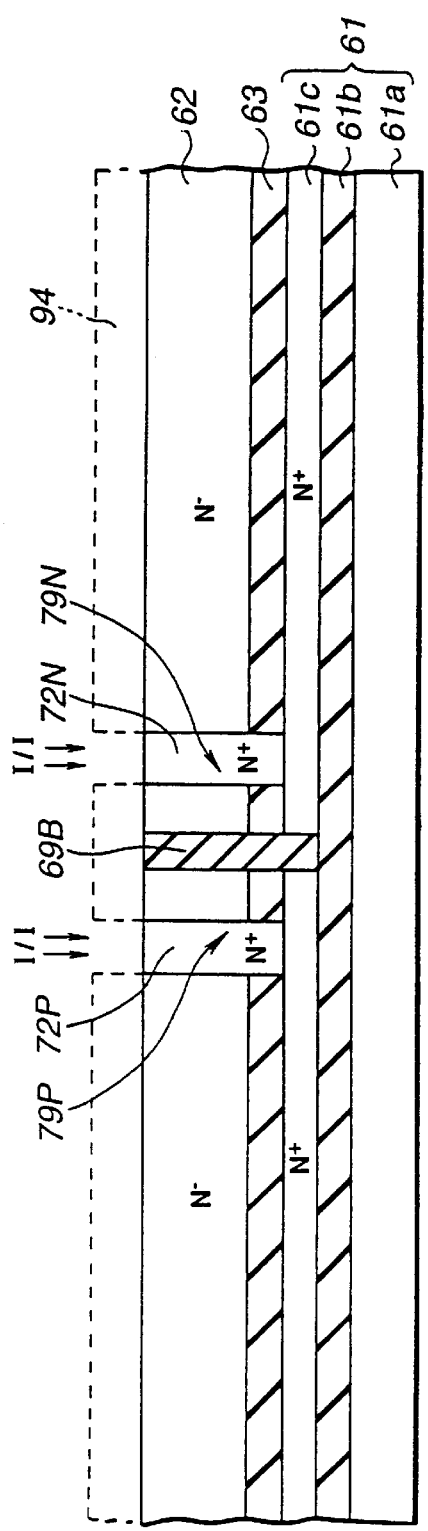
Figure 8:
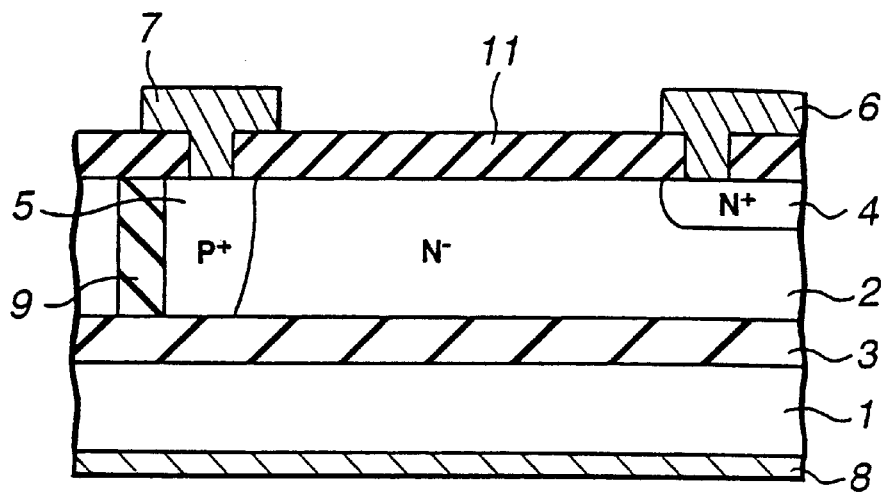
FIG. 8 is a cross section of the before discussed semiconductor device according to the prior art.
Figure 9:
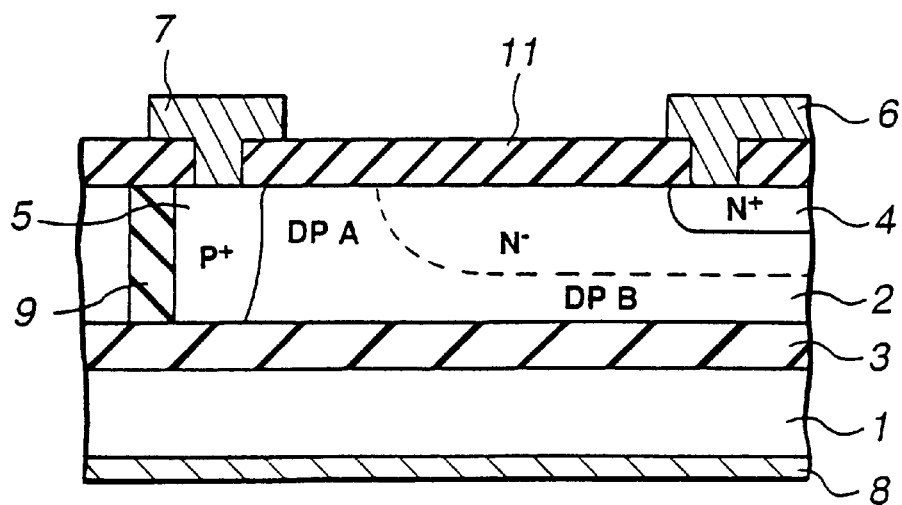
FIG. 9 illustrates the device shown in FIG. 8 in operational mode.

Selective dry etching technique is used to make first and second substrate access grooves 79N and 79P within the first and second substrate access regions 600N and 600P, respectively. The first and second substrate access grooves 79N and 79P extend from the surface of the semiconductor layer 62 down to the first and second regions of the conductive layers 61c, respectively, through the silicon dioxide layer 63. CVD technique is used to deposit a high resistive polysilicon over the SOI substrate to fill the first and second substrate access grooves 79N and 79P for subsequent removal by CMP (Chemical Mechanical Polishing) except the polysilicon layer filling the grooves 79N and 79P as shown in FIG. 7B. The polysilicon may be removed by dry etching or wet etching instead of CMP. As shown by the dotted line in FIG. 7B, a photoresist 94 is used as a mask for ion implantation of phosphorus (P) into the polysilicon filling the first and second substrate access grooves 79N and 79P. After removal of the photoresist 94, the phosphorus (P) is thermally diffused to form the first and second N+ type conductive zones 72N and 72P. The high resistive polysilicon film and the subsequent ion implantation may be replaced by filling the first and second substrate access grooves 79N and 79P with a low resistive polysilicon containing phosphorus (P).

Referring to FIG. 7C, a known technique is used to form an N channel high-voltage MOSFET within the first component forming region 500N. A P type semiconductor zone 65N extends from the surface of the semiconductor layer 62 down to the surface of the silicon dioxide film 63 along the periphery of the first component forming region 500N. A N+ type semiconductor zone 64N extends into the semiconductor layer 62 from the surface at a central portion surrounded by the P type semiconductor zone 65N. A N+ type semiconductor zone 73N and a P+ type semiconductor zone 74N extend into the P type conductive zone 65N from the surface. The N+ type semiconductor zone 73N is spaced from P-N junction between the semiconductor layer 62 and the P type semiconductor zone 65N by a predetermined distance to define therebetween a channel. The P+ type semiconductor zone 74N adjoins the N+ type semiconductor zone 73N. Concurrently with the formation of the N channel high-speed MOSFET a P channel high-speed MOSFET is formed within the second component forming region 500P. A P type semiconductor zone 65P extends from the surface of the semiconductor layer 62 down to the surface of the silicone dioxide film 63 and extends laterally so that the insulator layer 62 is left along the periphery of the second component forming region 500N by a predetermined width. A P+ type semiconductor zone 64P extends from the surface into the P type semiconductor zone 65P. A P+ type semiconductor zone 73P and a N+ type semiconductor zone 74P extend into the semiconductor layer 62 from the surface. The P+ type semiconductor zone 73P is spaced from P-N junction between the semiconductor layer 62 and the P type semiconductor zone 65P by a predetermined distance to define therebetween a channel. The N+ type semiconductor zone 74P adjoins the P+ type semiconductor zone 73P. On the surface of the semiconductor layer 62, a first gate contact 76N is provided, which faces via a gate oxidation film 75N the channel between the N+ semiconductor zone 73N and the boundary between the P type semiconductor zone 65N and the semiconductor layer 62. A second gate contact 76P is formed over the surface of the semiconductor layer 62 and faces via a gate oxidation film 75P the channel between the P type semiconductor zone 65P and the P+ type semiconductor zone 73P.

Selective dry etching technique is used to make a groove 77 that extends from the surface of the semiconductor layer 62 down to the surface of the silicon dioxide layer 63. The groove 77 is disposed and extends laterally in such a manner as to separate the first and second substrate access regions 600N and 600P from the first and second component forming regions 500N and 500P, respectively, as shown in FIG. 7D.

As shown in FIG. 3, an insulator zone 69A fills the groove 77 and an insulator film 71 is deposited on the surface of the semiconductor layer 62 except portions where drain contacts 66N, 66P, source contacts 67N, 67P and substrate contacts 68N, 68P are to be formed. The insulator zone 69A and the insulator film 71 are formed by depositing, by CVD, an insulator film over the surface of the SOI substrate to fill the groove 77. Subsequently, photolithography and dry etching techniques are used to remove unnecessary portions of the insulator film.

With sputtering, an aluminum film is formed over the surface of the SOT substrate. The aluminum film is removed, by photolithography and dry etching, except portions, which will make drain contacts 66N and 66P, source contacts 67P and 67N, and substrate contacts 68P and 68N. The drain contact 66N is on the N+ type semiconductor zone 64N. The source contact 67N is on the N+ type semiconductor zone 73N and the P+ types semiconductor zone 74N. The substrate contact 68N is on the conductive zone 72N. The drain contact 66P is on the P+ type semiconductor zone 64P. The source contact 67P is on the P+ type semiconductor zone 73P and the N+ type semiconductor zone 74P. The substrate contact 68P is on the conductive zone 72P. The substrate contact 68N is connected to the source contact 67N to receive the same potential. The substrate contact 68P is connected to the source contact 67P to receive the same potential.

While the present invention has been particularly described, in conjunction with several preferred embodiments, it is evident that many alternatives, modifications and variations will be apparent to those skilled in the art in light of the foregoing description. It is therefore contemplated that the appended claims will embrace any such alternatives, modifications and variations a as falling within the true scope and spirit of the present invention.

What is claimed is:

1. A semiconductor device comprising:
   a substrate;
   an insulator formed on said substrate contiguously to a surface thereof;
   a semiconductor layer formed on said insulator;
   a component forming region in said semiconductor layer only;
   a substrate access region extending from a surface of said semiconductor layer down toward said substrate and electrically insulated from said component forming region; and
   a substrate contact on the surface of said semiconductor layer within said substrate access region for the control of a surface potential of said substrate;
   said insulator electrically insulating and separating said semiconductor layer from said substrate.

2. The semiconductor device as claimed in claim 1, wherein said substrate is a semiconductor substrate.

3. The semiconductor device as claimed in claim 1, wherein said substrate access region includes a conductive zone, which is contiguous to said substrate contact and extends from the surface of said semiconductor layer down through said insulator to said substrate.

4. The semiconductor device as claimed in claim 1, further comprising:
   a component contact on the surface of said semiconductor layer within said component forming region,
   wherein said substrate contact is electrically connected to said component contact.

5. The semiconductor device as claimed in claim 4, wherein said component forming region includes a component in the form of a high voltage diode, and said component contact is an anode contact of said high voltage diode.

6. The semiconductor device as claimed in claim 4, wherein said component forming region includes a component in the form of a high voltage MOSFET, and said component contact is a source contact of said high voltage MOSFET.

7. A semiconductor device comprising:
   a substrate including a first region and a second region;
   an insulator formed on said substrate contiguously thereto;
   a semiconductor layer formed on said insulator contiguously thereto;
   a first component forming region formed in said semiconductor layer only and over said first region of said substrate;
   a second component forming region formed in said semiconductor layer only and over said second region of said substrate,
   said first and second component forming regions being electrically insulated from each other;
   a first substrate access region extending from a surface of said semiconductor layer down toward said first region of said substrate and electrically insulated from said first and second component forming regions;
   a second substrate access region extending from the surface of said semiconductor layer down toward said second region of said substrate and electrically insulated from said first and second component forming regions,
   said first and second substrate access regions being electrically insulated from each other;
   a first substrate contact on the surface of said semiconductor layer within said first substrate access region for the control of a surface potential of said first region of said substrate; and
   a second substrate contact on the surface of said semiconductor layer within said second substrate access region for the control of a surface potential of said second region of said substrate;
   said insulator electrically insulating and separating said semiconductor layer from said substrate.

8. The semiconductor device as claimed in claim 7, wherein said substrate includes a semiconductor base, a second insulator contiguous to said semiconductor base, and a substrate conductive layer on said second insulator film, and further comprising an insulator zone, which extends from the surface of said semiconductor down through said substrate conductive layer to second insulator, thereby to define boundary between said first and second regions of said substrate.

9. The semiconductor device as claimed in claim 7, wherein said first substrate access region includes a first conductive zone, which is contiguous to said first substrate contact and extends from the surface of said semiconductor layer down through said insulator to said first region of said substrate, and said second substrate access region includes a second a conductive zone, which is contiguous to said second substrate contact and extends from the surface of said semiconductor layer down through said insulator to said second region of said substrate.

10. The semiconductor device as claimed in claim 7, further comprising:
    a first component contact on the surface of said semiconductor layer within said first component forming region; and
    a second component contact on the surface of said semiconductor layer within said second component a forming region,
    wherein said first substrate contact is electrically connected to said first component contact, and said second substrate contact is electrically connected to said second component contact.

11. The semiconductor device as claimed in claim 10, wherein said first component forming region includes a first component in the form of a high voltage MOSFET, and said component contact is a source contact of said high voltage MOSFET.

* * * * *